United States Patent
Park

(10) Patent No.: US 10,121,989 B2
(45) Date of Patent: Nov. 6, 2018

(54) FLEXIBLE DISPLAY DEVICE HAVING AUXILIARY MEMBER AT BENDING AXIS

(71) Applicant: SAMSUNG DISPLAY CO., LTD., Yongin-si, Gyeonggi-do (KR)

(72) Inventor: Changmin Park, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/417,684

(22) Filed: Jan. 27, 2017

(65) Prior Publication Data

US 2017/0222179 A1 Aug. 3, 2017

(30) Foreign Application Priority Data

Jan. 29, 2016 (KR) ........................ 10-2016-0011835

(51) Int. Cl.
| | |
|---|---|
| *H01L 29/08* | (2006.01) |
| *H01L 21/00* | (2006.01) |
| *H01L 51/52* | (2006.01) |
| *H01L 27/32* | (2006.01) |
| *H01L 51/00* | (2006.01) |

(52) U.S. Cl.
CPC ...... *H01L 51/5246* (2013.01); *H01L 27/3244* (2013.01); *H01L 27/3248* (2013.01); *H01L 51/0097* (2013.01)

(58) Field of Classification Search
CPC ............. H01L 51/5246; H01L 51/0097; H01L 27/0097; H01L 27/3244
See application file for complete search history.

(56) References Cited

U.S. PATENT DOCUMENTS

| | | | | |
|---|---|---|---|---|
| 9,366,802 | B2* | 6/2016 | Lee .......................... | H05K 5/02 |
| 9,781,826 | B2* | 10/2017 | Jeong ...................... | G09F 9/301 |
| 9,786,207 | B2* | 10/2017 | Kim ........................ | G09F 9/301 |
| 2013/0342090 | A1 | 12/2013 | Ahn et al. | |
| 2014/0101575 | A1 | 4/2014 | Kwak et al. | |
| 2014/0226275 | A1 | 8/2014 | Ko et al. | |
| 2014/0285992 | A1* | 9/2014 | Yang ................. | G02F 1/133305 |
| | | | | 361/809 |
| 2014/0300529 | A1* | 10/2014 | Kim ...................... | H01L 27/326 |
| | | | | 345/80 |

(Continued)

FOREIGN PATENT DOCUMENTS

| | | |
|---|---|---|
| KR | 10-2014-0046346 | 4/2014 |
| KR | 10-1386220 | 4/2014 |

(Continued)

*Primary Examiner* — Alonzo Chambliss
(74) *Attorney, Agent, or Firm* — F. Chau & Associates, LLC

(57) ABSTRACT

A flexible display device includes a cover member having a bending area and a non-bending area. The non-bending area is disposed on opposite sides of the bending area. The bending area is bent or folded about a bending axis. A display panel is disposed under both the bending area and the non-bending area of the cover member. The display panel has a smaller area than that of the cover member. An auxiliary member is disposed alongside the display panel, and under the bending area of the cover member, such that a width of the cover member is substantially equal to a width of the display panel plus a width of the auxiliary member.

20 Claims, 4 Drawing Sheets

(56) References Cited

U.S. PATENT DOCUMENTS

| | | | |
|---|---|---|---|
| 2015/0043174 A1* | 2/2015 | Han | G02F 1/13452 |
| | | | 361/749 |
| 2015/0055287 A1 | 2/2015 | Seo | |
| 2015/0070744 A1 | 3/2015 | Danner et al. | |
| 2015/0085433 A1* | 3/2015 | Kim | G06F 1/1641 |
| | | | 361/679.01 |
| 2015/0109544 A1 | 4/2015 | Yeo et al. | |
| 2015/0153778 A1* | 6/2015 | Jung | G06F 1/1677 |
| | | | 345/156 |
| 2015/0207102 A1* | 7/2015 | Jeong | H04M 1/0268 |
| | | | 257/40 |
| 2015/0241925 A1* | 8/2015 | Seo | G06F 1/1681 |
| | | | 361/679.27 |
| 2015/0311446 A1* | 10/2015 | Inoue | H01L 51/0052 |
| | | | 257/40 |
| 2015/0370287 A1* | 12/2015 | Ko | G06F 1/1626 |
| | | | 361/749 |
| 2015/0380679 A1* | 12/2015 | Fujiyoshi | H01L 51/5253 |
| | | | 257/99 |
| 2016/0126496 A1* | 5/2016 | Wang | H01L 51/5256 |
| | | | 257/40 |
| 2016/0190216 A1* | 6/2016 | Yang | G01B 7/18 |
| | | | 257/91 |
| 2017/0030189 A1* | 2/2017 | Gianchandani | E21B 43/267 |

FOREIGN PATENT DOCUMENTS

| | | |
|---|---|---|
| KR | 10-2014-0101295 | 8/2014 |
| KR | 10-2014-0130537 | 11/2014 |
| KR | 10-2015-0024172 | 3/2015 |
| KR | 10-2015-0043604 | 4/2015 |
| KR | 10-2015-0045556 | 4/2015 |

* cited by examiner

FLEXIBLE DISPLAY DEVICE HAVING AUXILIARY MEMBER AT BENDING AXIS

CROSS-REFERENCE TO RELATED APPLICATION

This application claims priority to Korean Patent Application No. 10-2016-0011835, filed on Jan. 29, 2016, in the Korean Intellectual Property Office, the disclosure of which is incorporated by reference herein in its entirety.

TECHNICAL FIELD

The present disclosure relates to a display device, and more particularly, to a flexible display device having increased durability when bent or folded.

DISCUSSION OF THE RELATED ART

Flat panel display devices have become very popular, particularly for use in portable electronic devices, Flat panel display devices are noted for being thin and light. Flat panel display devices may also be made flexible.

However, flexible fiat panel display devices may be prone to deforming or breaking at their bent or folded regions, particularly under stress. This can result in a display panel that is at least partially inoperable or suffers from reduced image quality.

SUMMARY

A flexible display device includes a cover member having a bending area and a non-bending area. The non-bending area is disposed on opposite sides of the bending area. The bending area is bent or folded about a bending axis. A display panel is disposed under both the bending area and the non-bending area of the cover member. The display panel has a smaller area than that of the cover member. An auxiliary member is disposed alongside the display panel, and under the bending area of the cover member, such that a width of the cover member is substantially equal to a width of the display panel plus a width of the auxiliary member.

An electronic device includes a cover including a transparent window. A display panel is disposed below the cover such that the display panel is viewable though the transparent window. A first auxiliary spacer is disposed on one side of the display panel. A second auxiliary spacer is disposed on an opposite side of the display panel. The electronic device is bendable about a bending axis. The first auxiliary spacer and the second auxiliary spacer are disposed along the bending axis. The first and second auxiliary spacers each have a height that is equal to a height of the display panel.

A flexible display device includes a flexible substrate, a thin film transistor (TFT) disposed on the substrate, a planarizing layer disposed over the TFT, a pixel electrode disposed over the planarizing layer and making contact with the TFT, an opposite electrode disposed over the pixel electrode, an organic emission layer disposed between the pixel electrode and the opposite electrode, an auxiliary member disposed alongside the flexible substrate, a cover member disposed over the flexible substrate such that the TFT, planarizing layer, pixel electrode, organic emission layer, and the opposite electrode are disposed between the flexible substrate and the cover member, and a support plate disposed under the flexible substrate. The auxiliary member directly contacts the support plate and the cover member.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
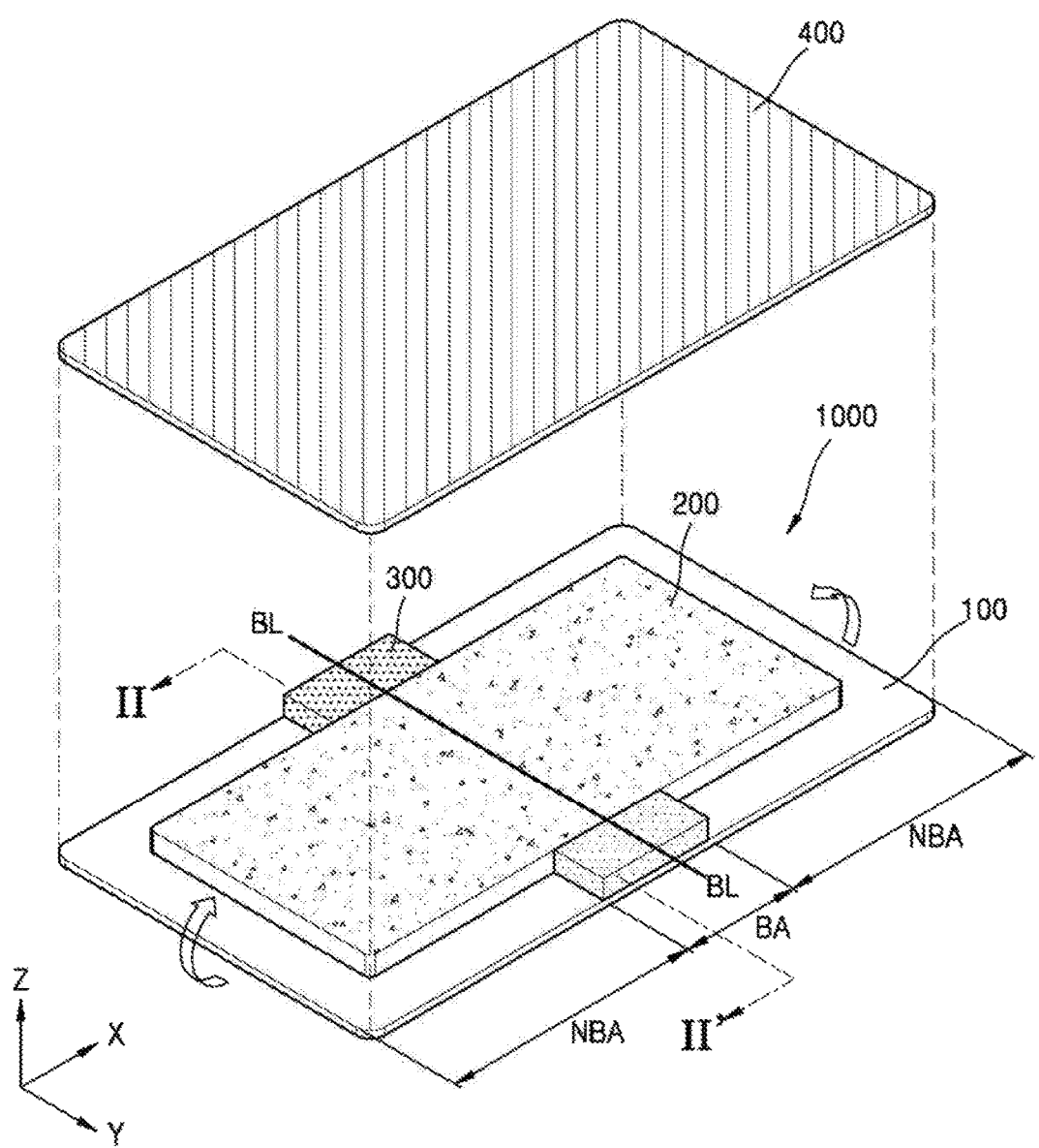
FIG. 1 is a perspective view illustrating a flexible display device according to an exemplary embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Hereinafter, the inventive concept will be described more fully with reference to the accompanying drawings, in which exemplary embodiments of the inventive concept are shown. When description is made with reference to the drawings, like reference numerals in the drawings may denote like or corresponding elements, and repeated description thereof may be omitted. In the drawings, for clear description, the thicknesses of a plurality of layers and regions may be magnified. Also, in the drawings, for convenience of description, the thickness of some layers and regions may be exaggerated.

Figure 2:
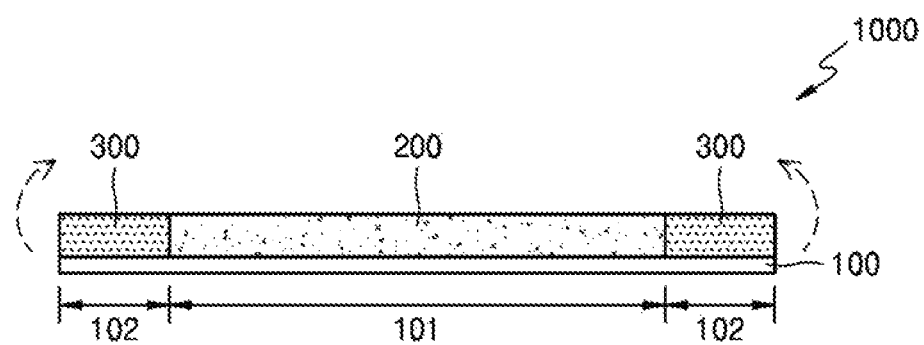
FIG. 2 is a cross-sectional view illustrating the flexible display device taken along a line II-II' of FIG. 1.

FIG. 1 is a perspective view illustrating a flexible display device 1000 according to an exemplary embodiment of the present invention, and FIG. 2 is a cross-sectional view illustrating the flexible display device taken along a line II-II' of FIG. 1.

Referring to FIG. 1, the flexible display device 1000, according to an exemplary embodiment of the present invention, includes a cover member 100, a display panel 200 disposed above the cover member 100, and an auxiliary member 300. Also, a support member 400 may be disposed above a surface of the display panel 200. In this way, the display panel 200 may be disposed between the support member and the cover member 100.

The cover member 100 includes a bending area BA and a non-bending area NBA. As the non-bending area NBA may be divided by the bending area BA, the non-bending area NBA may be thought of as a pair of non-bending areas NBAs. The bending area BA of the cover member 100 may be bent or folded about a bending axis BL. The non-bending area NBA of the cover member 100 extends from both sides of the bending area BA. At least a portion of the non-bending area NBA may have a flat shape, but other shapes may be possible as well. For example, the non-bending area NBA may have a partially curved shape in which a bending degree is smaller than a bending degree in the bending area BA.

The cover member 100 may function as a touch panel, a polarization plate, a window, etc., or a combination thereof. For convenience of description, a case where the cover member 100 is a window is mainly described below, but the cover member may alternatively be formed of other elements, Where the cover member is a window 100, the cover member may protect the display panel 200 from external impact, scratching, and from harmful elements.

In the case where the cover member 100 is a window, the cover member 100 may include a transparent material such that an image generated by the display panel 200 is visible through the cover member 100, For example, the cover member 100 may include a glass material or a plastic material such as a polymethylmethacrylate (PMMA) resin and a polycarbonate (PC) resin. Therefore, the flexible display device 1000 may project an image generated from the display panel 200 through the cover member 100. Also, the cover member 100 may be a thin film and may be flexible such that the cover member 100 is easily bent or folded with the display panel 200, without cracking or breaking.

The display panel 200 may be disposed above the cover member 100. The display panel 200 may be disposed above both the bending area BA and the non-bending area NBA of the cover member 100. In this case, the display panel 200 is within the area defined by the cover member 100. The display panel 200 includes a plurality of display elements (e.g. pixels) and thin film transistors for controlling the display elements. In this way, the display panel 200 generates an image for the display device 1000. The display panel 200 is described below with reference to FIG. 6.

The auxiliary member 300 is disposed between the edge of the cover member 100 and the display panel 200. For example, the auxiliary member 300 is disposed above the cover member 100 and is disposed outside the display panel 200, In this case, the auxiliary member 300 may contact the display panel 200 and/or may be adjacent to the display panel 200, even when the auxiliary member 300 is separated from the display panel 200. At least a portion of the auxiliary member 300 may be disposed within the bending area BA and at least this portion of the auxiliary member 300 may extend in a +X direction (or −X direction), which is a direction perpendicular to the bending axis BL (which may extend along the +/−Y direction).

Next, referring to FIG. 2, the cover member 100 may include a first portion 101. The first portion 101 may be defined as the portion of the cover member that is aligned with the display panel 200. and the cover member 100 may also have a second portion 102, which is an outer portion of the cover member 100 surrounding the display panel 200. The auxiliary member 300 is disposed above the second portion 102. Though FIGS. 1 and 2 illustrate that the auxiliary member 300 is disposed at both sides of the display panel 200, the auxiliary member 300 may be disposed at either one of the two sides of the display panel 200. Also, the auxiliary member 300 may have a thickness equal to that of the display panel 200. Therefore, the support member 400 and the cover member 100, which are disposed at opposite sides of the display panel 200, may stably support the auxiliary member 300 and the display panel 200, which are arranged therebetween. Also, when the bending area BA of the cover member 100 is bent or folded, the presence of a floating space or an interfering portion between the display panel 200 and the support member 400, or between the auxiliary member 300 and the support member 400, may be prevented.

As described above, the auxiliary member 300 may include a flexible material. As a portion of the auxiliary member 300 is disposed within the bending area BA, at least that portion of the auxiliary member 300 may be flexible, and the auxiliary member 300 may also be configured to perform a buffering function between the support member 400 and the second portion 102 of the cover member 100. The auxiliary member 300 may include an organic material and may include, for example, rubber, a foaming agent resin, etc.

Referring to FIG. 1 again, the support member 400 may be disposed to oppose the cover member 100, and the display panel 200 may be disposed between the support member 400 and the cover member 100. The support member 400 may protect one side of the display panel 200 that is adjacent to the support member 400 and may support the display panel 200 between the cover member 100 and the support member 400. The edge portion of the support member 400 may be bent toward the cover member 100 and may house the display panel 200. Also, like the cover member 100, the support member 400 may include a flexible material such that the support member 400 is easily bent or folded along with the display panel 200.

Though FIGS. 1 and 2 illustrate that the flexible display device 1000 is bent or folded such that the flexible display device 1000 concaves in the direction of the cover member 100, the flexible display device 1000 may be bent or folded such that the flexible display device 1000 concaves in the direction of the support member 400. However, for convenience of description, a case where the flexible display device 1000 is bent or folded such that the flexible display device 1000 concaves in the direction of the cover member 100 is mainly described below.

Figure 3:
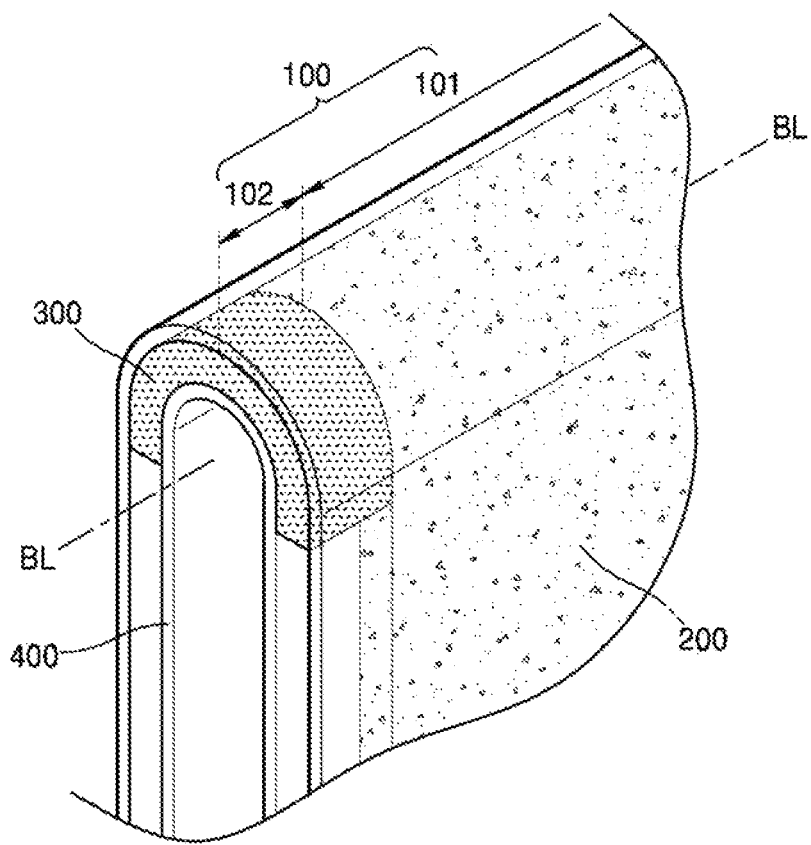
FIG. 3 is a perspective view illustrating the flexible display device of FIG. 1 when the flexible display device is bent or folded, according to an exemplary embodiment of the present disclosure.

FIG. 3 is a perspective view illustrating the flexible display device 1000 of FIG. 1, when the flexible display device 1000 is bent or folded.

Referring to FIG. 3, the flexible display device 1000 may be bent or folded about the bending axis BL such that the flexible display device 1000 concaves in the direction of the cover member 100. Here, the description that the flexible display device 1000 is bent or folded denotes that the cover member 100, the display panel 200, etc. are correspondingly bent or folded around the bending axis BL. Also, a portion of the cover member 100 where bending or folding occurs denotes the bending area BA illustrated in FIG. 1, etc. Since the flexible display device 1000 is bent or folded such that the flexible display device 1000 concaves in the direction of the cover member 100, the curvature center of the cover member 100 may be closer to the display panel 200 and the support member 400 than the cover member 100.

The auxiliary member 300 is disposed between the second portion 102 of the cover member 100 and the support member 400 and is bent or folded. Therefore, when the second portion 102 of the cover member 100 is bent or folded with another member, such as the support member 400, the auxiliary member 300 may serve as a buffering material such that interference or floating does not occur between the cover member 100 and the support member 400. A manner in which the bending area BA of the cover member 100 is bent or folded along with the auxiliary member 300, is described with reference to FIGS. 4A, 4B, and 5.

Figure 4A:
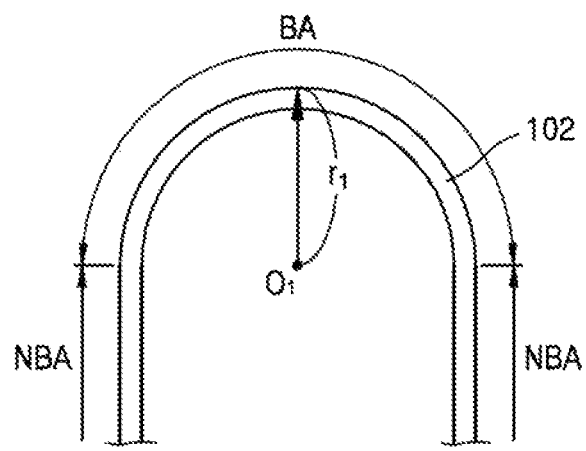
FIGS. 4A and 4B are cross-sectional views illustrating a comparative example of a flexible display device when bent or folded.
Figure 4B:
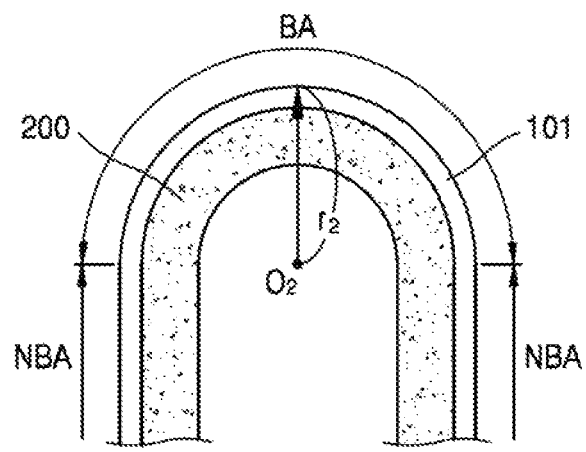
Figure 5:
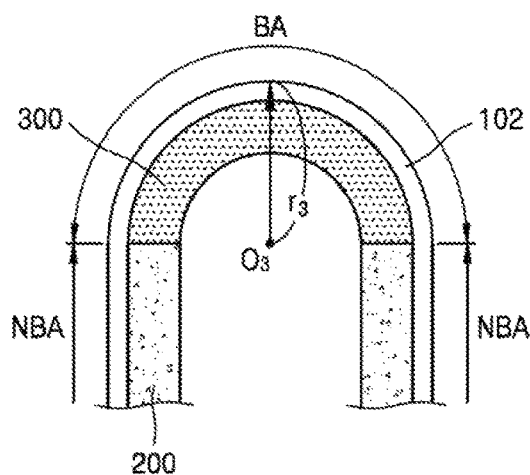
FIG. 5 is a cross-sectional view illustrating a flexible display device bent or folded according to an exemplary embodiment of the present disclosure.

FIGS. 4A and 4B are cross-sectional views illustrating a comparative example of a flexible display device which is bent or folded, and FIG. 5 is a cross-sectional view illustrating a flexible display device bent or folded according to an exemplary embodiment of the present invention.

FIGS. 4A and 4B illustrate the comparative example of the flexible display device. The comparative example may be similar to the approach illustrated in FIGS. 1 to 3. However, the auxiliary member 300 is not provided in the comparative example. In the case of the comparative example, the curvature radius of the first portion 101, which is a portion of the cover member 100 where the display panel 200 is arranged, may be different from the curvature radius of the second portion 102, which is an outer portion of the cover member 100, surrounding the display panel 200. FIG. 4A illustrates the second portion 102 of the cover member 100 in the comparative example in a bent or folded state, and FIG. 4B illustrates the first portion 101 of the cover member 100 in the comparative example in a bent or folded state. Here, to better emphasize a difference of a bent or folded state illustrated in FIG. 4B, FIG. 4A illustrates only the second portion 102 of the cover member 100, which is a portion where the bending or folding occurs, and omits a portion in which the bending or folding does not occur (or a portion in which less bending or folding occurs).

As illustrated in FIG. 4A, only the second portion 102 of the cover member 100 is in a portion of the bending area BA that corresponds to the second portion 102 of the cover member 100 without overlapping with a member such as the display panel 200. In this case, the curvature radius of this second portion 102 in the bending area BA is r1. Meanwhile, as illustrated in FIG. 4B, the display panel 200 is disposed above the first portion 101 of the cover member 100 in a portion of the bending area BA that corresponds to the first portion 101 of the cover member 100. In this case, the curvature radius of the first portion 101 in the bending area BA is r2. When FIG. 4A is compared with FIG. 4B, since the second portion 102 of the cover member 100 in the bending area BA is thinner and more flexible than a stacked arrangement including the first portion 101 of the cover member 100 and the display panel 200, the curvature radius r1 of the second portion 102 may be less than the curvature radius r2 of the stacked arrangement of the first portion 101 and the display panel 200. For example, the second portion 102 of the cover member 100 may be more deformed than the first portion 101 of the cover member 100, and a difference in the amount of deformation may occur between the second portion 102 and the first portion 101. Therefore, the second portion 102 may become crushed, within the region of curvature, and non-uniform deformation may occur in the cover member 100. In a serious case, the second portion 102 may be destroyed as it makes contact with a lower structure, such as the support member 400 illustrated in FIG. 3.

According to exemplary embodiments of the present invention, and as illustrated in FIG. 5, the second portion 102 may be bent or folded in the same way as, or in a similar way as, the first portion 101 illustrated in FIG. 4B by disposing the auxiliary member 300, serving as a buffering material, in a portion of the bending area BA that corresponds to the second portion 102 of the cover member 100. Here, the auxiliary member 300 disposed above the second portion 102 performs a function corresponding to the display panel 200, etc. above the first portion 101, For example, since the auxiliary member 300 having a thickness equal to or similar to that of the display panel 200 is disposed above the second portion 102 of the cover member 100, the crushing and/or interference of the second portion 102 with the lower structure may be prevented.

Also, according to this approach, a difference between the curvature of the first portion 101 and the curvature of the second portion 102 is reduced, As illustrated in FIG. 5, the curvature radius of the stacked arrangement of the second portion 102 and the auxiliary member 300 is r3, which is different from the curvature radius r1 of the second portion 102 illustrated in FIG. 4A. The radius r3 is greater than the curvature radius r1 of the second portion 102 illustrated in FIG. 4A. Here, the radius r3 may have various values depending on a material of the auxiliary member 300. For example, r3 may he equal to, or similar to, r2, which is the curvature radius of the first portion 101 illustrated in FIG. 4B. The reduction in the difference between the curvature radius of the first portion 101 and the curvature radius of the second portion 102 may mean that a difference in the amount of deformation between the first portion 101 and the second portion 102 is reduced and thus bending of the cover member 100 in a direction parallel to the bending axis BL may be uniform.

Figure 6:
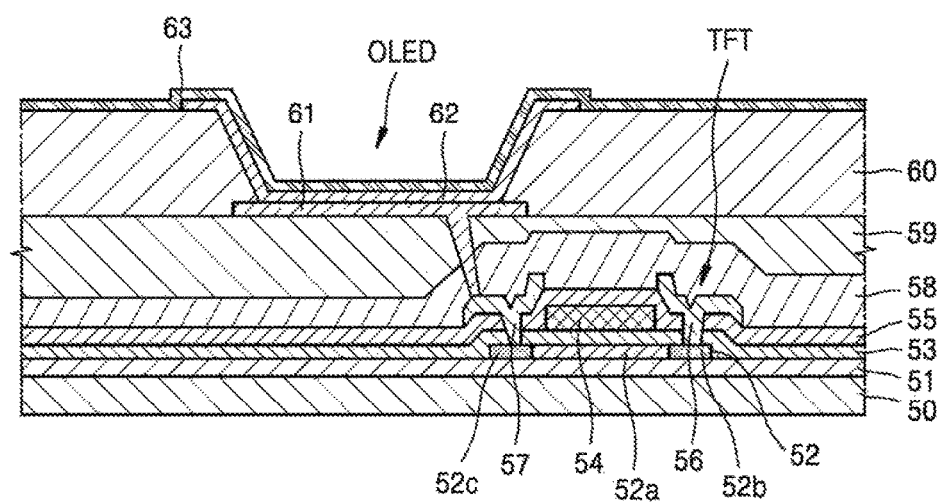
FIG. 6 is a cross-sectional view illustrating a flexible display device bent or folded according to an exemplary embodiment of the present disclosure.

FIG. 6 is a cross-sectional view of a flexible display device bent or folded according to an exemplary embodiment of the present invention. Hereinafter, for convenience of description, a case where a flexible display device, according to an exemplary embodiment of the present invention, is an organic light-emitting display device is mainly described below. However, other forms of display devices may alternatively be used.

Referring to FIG. 6, in the flexible display device, according to an exemplary embodiment of the present invention, various elements are disposed above a substrate 50.

The substrate 50 may include a material having a good flexibility. For example, the substrate 50 may include an organic material such as polyimide (PI), polyethylene naphthalate (PEN), polyethylene terephthalate (PET), polyetheretherketone, polyether sulfone (PES), PMMA, polycarbonate (PC), and/or polypropylene (PP). Particularly, in a case of using PI having a relatively large heat resistance and degree of flexibility, a transparent flexible substrate may be formed.

Common layers such as a buffer layer 51, a gate insulating layer 53, and an interlayer insulating layer 55 may be disposed above the substrate 50 and over its entire surface. A patterned semiconductor layer 52, including a channel region 52a, a source contact region 52b, and a drain contact region 52c, may he disposed above the substrate 50. With the patterned. semiconductor layer, a gate electrode 54, a source electrode 56, and a drain electrode 57, which are elements of a thin film transistor (TFT), may be disposed above the substrate 50.

A protective layer 58 covers the TFT. A planarization layer 59, having an approximately planarized upper surface, covers the protective layer 58. The protective layer 58 and the planarization layer 59 may each he disposed over the entire surface of the substrate 50. An organic light-emitting diode (OLED) may be disposed above the planarization layer 59. The OLED includes a patterned pixel electrode 61, an opposite electrode 63, approximately corresponding to the entire surface of the substrate 50, and an intermediate layer 62, having a multi-layered structure. The intermediate layer 62 is disposed between the pixel electrode 61 and the opposite electrode 63. The intermediate layer 62 may include an emission layer (EML). The intermediate layer 62 may also include a hole injection layer (HIL) and a hole transport layer (HTL) on either side of the emission layer EML. The intermediate layer 62 may also include an electron transport layer (ETL) and an electron injection layer (EIL), which may be disposed between the HIL/HTL and the emission layer EML, respectively. These layers may be formed by a method such as deposition.

Unlike the approach illustrated in FIG. 6, according to other exemplary embodiments of the present invention, a portion of the intermediate layer 62 may be a common layer approximately corresponding to the entire surface of the substrate 50, and another portion of the intermediate layer 62 may be a pattern layer patterned to correspond to the pixel electrode 61. The pixel electrode 61 may be electrically connected to the TFT through a via hole. In other embodiments, a pixel-defining layer 60 having an opening, which covers the edge of the pixel electrode 61 and which defines each pixel region, may he disposed above the planarization layer 59 and may approximately correspond to the entire surface of the substrate 50.

As described above, a flexible display device according to exemplary embodiments of the present invention may have increased durability when bent or folded compared to other flexible display devices.

Though the inventive concept has been described with reference to the embodiments illustrated in the drawings, this is merely exemplary and it will be understood by those of ordinary skill in the art that various changes in form and details and equivalents thereof may be made therein without departing from the spirit and scope of the inventive concept.

What is claimed is:

1. A flexible display device comprising:
  a cover member comprising a bending area and a non-bending area, the non-bending area disposed on opposite sides of the bending area, the bending area being bent or folded about a bending axis;
  a display panel disposed under both the bending area and the non-bending area of the cover member, the display panel having a smaller area than that of t:he cover member; and
  an auxiliary member disposed alongside the display panel, and under the bending area of the cover member, such that a width of the cover member is substantially equal to a width of the display panel plus a width of the auxiliary member.

2. The flexible display device of claim 1, wherein the auxiliary member comprises two portions disposed on opposing sides of the display panel.

3. The flexible display device of claim 1, wherein the cover member is a thin film.

4. The flexible display device of claim 1, wherein an image generated from the display panel is viewed through the cover member.

5. The flexible display device of claim 1, wherein at least a portion of the cover member comprises a transparent material.

6. The flexible display device of claim 1, wherein the auxiliary member extends along an edge of the cover member that runs perpendicularly to the bending axis.

7. The flexible display device of claim 1, wherein the auxiliary member has a thickness equal to that of the display panel, as measured from a top surface of the display panel to a bottom surface of the display panel.

8. The flexible display device of claim 1, wherein the auxiliary member comprises an organic material.

9. An electronic device, comprising:
  a cover including a transparent window;
  a display panel disposed below the cover such that the display panel is viewable though the transparent window;
  a first auxiliary spacer disposed on one side of the display panel; and
  a second auxiliary spacer disposed on an opposite side of the display panel,
  wherein the electronic device is bendable about a bending axis,
  wherein the first auxiliary spacer and the second auxiliary spacer are disposed along the bending axis, and
  wherein the first and second auxiliary spacers each have a height that is equal to a height of the display panel.

10. The electronic device of claim 9, wherein the width of the first auxiliary spacer plus the display panel plus the second auxiliary spacer, along the bending axis, is substantially equal to the width of the cover along the bending axis.

11. The electronic device of claim 9, wherein the length of the first and second auxiliary spacers, in a direction perpendicular to the direction of the bending axis, is smaller than the length of the display device in the direction perpendicular to the direction of the bending axis.

12. The electronic device of claim 9, wherein the cover is a thin film.

13. The electronic device of claim 9, wherein each of the first and second auxiliary members comprises an organic material.

14. A flexible display device comprising:
  a flexible substrate;
  a thin film transistor (TFT) disposed on the substrate;
  a planarizing layer disposed over the TFT;
  a pixel electrode disposed over the planarizing layer and making contact with the TFT;
  an opposite electrode disposed over the pixel electrode;
  an organic emission layer disposed between the pixel electrode and the opposite electrode;
  an auxiliary member disposed alongside the flexible substrate;
  a cover member disposed over the flexible substrate such that the TFT, planarizing layer, pixel electrode, organic emission layer, and the opposite electrode are disposed between the flexible substrate and the cover member; and
  a support plate disposed under the flexible substrate, wherein the auxiliary member directly contacts the support plate and the cover member,
  wherein the auxiliary member is disposed between the support plate and the cover member.

15. The flexible display device of claim 14, wherein the auxiliary member comprises two portions disposed on opposing sides of the flexible substrate.

16. The flexible display device of claim 14, wherein the cover member is a thin film.

17. The flexible display device of claim 14, wherein an image generated from the organic emission layer is viewed through the cover member.

18. The flexible display device of claim 14, wherein at least a portion of the cover member comprises a transparent material.

19. The flexible display device of claim 14, wherein the cover member is bendable about a bending axis that runs through a bending area of the cover member and the auxiliary member is disposed corresponding to the bending area of the cover member.

20. The flexible display device of claim 14, wherein the auxiliary member and the display panel have a same height.

* * * * *